US008037429B2

(12) United States Patent
Shang et al.

(10) Patent No.: US 8,037,429 B2
(45) Date of Patent: Oct. 11, 2011

(54) MODEL-BASED SRAF INSERTION

(75) Inventors: Shumay Dou Shang, Saratoga, CA (US); Lisa Swallow, Lake Oswego, OR (US); Yuri Granik, Palo Alto, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 1388 days.

(21) Appl. No.: 11/241,732

(22) Filed: Sep. 30, 2005

(65) Prior Publication Data

US 2006/0200790 A1    Sep. 7, 2006

Related U.S. Application Data

(60) Provisional application No. 60/658,278, filed on Mar. 2, 2005.

(51) Int. Cl.
*G06F 17/50* (2006.01)
(52) U.S. Cl. ........................................................ 716/53
(58) Field of Classification Search ............... 716/19–21, 716/50–56
See application file for complete search history.

(56) References Cited

U.S. PATENT DOCUMENTS

| | | | |
|---|---|---|---|
| 4,532,650 A | 7/1985 | Wihl et al. |
| 4,762,396 A | 8/1988 | Dumant et al. |
| 4,989,156 A | 1/1991 | Ikenaga |
| 5,396,584 A | 3/1995 | Lee et al. |
| 5,502,654 A | 3/1996 | Sawahata |
| 5,655,110 A | 8/1997 | Krivokapic et al. |
| 5,699,447 A | 12/1997 | Alumot et al. |
| 5,723,233 A | 3/1998 | Garza et al. |
| 5,815,685 A | 9/1998 | Kamon |
| 5,825,647 A | 10/1998 | Tsudaka |
| 5,879,844 A | 3/1999 | Yamamoto et al. |
| 5,886,908 A * | 3/1999 | Conn et al. ............ 703/2 |
| 5,991,006 A | 11/1999 | Tsudaka |
| 6,016,357 A | 1/2000 | Neary et al. |
| 6,042,257 A | 3/2000 | Tsudaka |
| 6,049,660 A | 4/2000 | Ahn et al. |
| 6,056,785 A | 5/2000 | Chisaka |
| 6,077,310 A | 6/2000 | Yamamoto et al. |
| 6,080,527 A | 6/2000 | Huang et al. |
| 6,120,952 A | 9/2000 | Pierrat et al. |
| 6,128,067 A | 10/2000 | Hashimoto |
| 6,187,483 B1 | 2/2001 | Capodieci et al. |
| 6,243,855 B1 | 6/2001 | Kobayashi et al. |
| 6,249,904 B1 | 6/2001 | Cobb |

(Continued)

FOREIGN PATENT DOCUMENTS

JP    09319067    12/1997

(Continued)

OTHER PUBLICATIONS

Socha et al., "Contact Hole Reticle Optimization by Using Interference Mapping Lithography (IML™)", Proceedings of SPIE, vol. 5446, pp. 516-534 (2004).*

(Continued)

*Primary Examiner* — Vurthe Siek
*Assistant Examiner* — Aric Lin

(57) ABSTRACT

A system for producing mask layout data retrieves target layout data defining a pattern of features, or portion thereof and an optimized mask layout pattern that includes a number of printing and non-printing features. Mask layout data for one or more subresolution assist features (SRAFs) is then defined to approximate one or more non-printing features of the optimized mask layout pattern.

6 Claims, 9 Drawing Sheets

U.S. PATENT DOCUMENTS

| | | | |
|---|---|---|---|
| 6,263,299 B1 | 7/2001 | Aleshin et al. | |
| 6,269,472 B1 | 7/2001 | Garza et al. | |
| 6,301,697 B1 | 10/2001 | Cobb | |
| 6,312,854 B1 | 11/2001 | Chen et al. | |
| 6,317,859 B1 | 11/2001 | Papadopoulou | |
| 6,370,679 B1 | 4/2002 | Chang et al. | |
| 6,416,907 B1 | 7/2002 | Winder et al. | |
| 6,425,117 B1 | 7/2002 | Pasch et al. | |
| 6,430,737 B1 | 8/2002 | Cobb et al. | |
| 6,453,452 B1 | 9/2002 | Chang et al. | |
| 6,453,457 B1 | 9/2002 | Pierrat et al. | |
| 6,467,076 B1 | 10/2002 | Cobb | |
| 6,470,489 B1 | 10/2002 | Chang et al. | |
| 6,499,003 B2 | 12/2002 | Jones et al. | |
| 6,574,784 B1 | 6/2003 | Lippincott et al. | |
| 6,620,561 B2 | 9/2003 | Winder et al. | |
| 6,643,616 B1 | 11/2003 | Granik et al. | |
| 6,649,309 B2 | 11/2003 | Mukherjee | |
| 6,665,845 B1 | 12/2003 | Aingaran et al. | |
| 6,668,367 B2 | 12/2003 | Cobb et al. | |
| 6,728,946 B1 | 4/2004 | Schellenberg et al. | |
| 6,748,578 B2 | 6/2004 | Cobb | |
| 6,792,159 B1 | 9/2004 | Aufrichtig et al. | |
| 6,792,590 B1 | 9/2004 | Pierrat et al. | |
| 6,815,129 B1 | 11/2004 | Bjorkholm et al. | |
| 6,817,003 B2 | 11/2004 | Lippincott et al. | |
| 6,851,103 B2 | 2/2005 | Van Den Broeke et al. | |
| 6,857,109 B2 | 2/2005 | Lippincott | |
| 6,887,633 B2 | 5/2005 | Tang | |
| 6,901,576 B2 | 5/2005 | Liebmann et al. | |
| 6,928,634 B2 | 8/2005 | Granik et al. | |
| 6,973,633 B2 | 12/2005 | Lippincott et al. | |
| 7,010,776 B2 | 3/2006 | Gallatin et al. | |
| 7,013,439 B2 | 3/2006 | Robles et al. | |
| 7,024,655 B2 | 4/2006 | Cobb | |
| 7,028,284 B2 | 4/2006 | Cobb et al. | |
| 7,047,516 B2 | 5/2006 | Futatsuya | |
| 7,073,162 B2 | 7/2006 | Cobb et al. | |
| 7,155,689 B2 | 12/2006 | Pierrat et al. | |
| 7,155,699 B2 | 12/2006 | Cobb | |
| 7,172,838 B2 | 2/2007 | Maurer et al. | |
| 7,181,721 B2 | 2/2007 | Lippincott et al. | |
| 7,237,221 B2 | 6/2007 | Granik et al. | |
| 7,240,305 B2 | 7/2007 | Lippincott | |
| 7,240,321 B2 | 7/2007 | Cobb et al. | |
| 7,247,574 B2 | 7/2007 | Van Den Broeke et al. | |
| 7,266,803 B2 | 9/2007 | Chou et al. | |
| 7,281,234 B2 | 10/2007 | Lippincott | |
| 7,293,249 B2 | 11/2007 | Robles et al. | |
| 7,324,930 B2 | 1/2008 | Cobb | |
| 7,367,009 B2 | 4/2008 | Cobb et al. | |
| 7,487,489 B2 | 2/2009 | Granik | |
| 7,493,587 B2 | 2/2009 | Word | |
| 7,552,416 B2 | 6/2009 | Granik et al. | |
| 2002/0199157 A1 | 12/2002 | Cobb | |
| 2003/0170551 A1 | 9/2003 | Futatsuya | |
| 2004/0005089 A1 | 1/2004 | Robles et al. | |
| 2004/0044431 A1* | 3/2004 | Pellegrini et al. | 700/121 |
| 2004/0088149 A1 | 5/2004 | Cobb | |
| 2005/0050490 A1 | 3/2005 | Futatsuya et al. | |
| 2005/0053848 A1* | 3/2005 | Wampler et al. | 430/5 |
| 2005/0149900 A1* | 7/2005 | Laidig | 716/19 |
| 2005/0149901 A1 | 7/2005 | Tang | |
| 2005/0251771 A1 | 11/2005 | Robles | |
| 2005/0278686 A1 | 12/2005 | Word et al. | |
| 2006/0188796 A1 | 8/2006 | Word | |
| 2006/0199084 A1 | 9/2006 | Word | |
| 2006/0240342 A1 | 10/2006 | Tang | |
| 2006/0269875 A1 | 11/2006 | Granik | |
| 2007/0006113 A1 | 1/2007 | Hu et al. | |
| 2007/0074143 A1 | 3/2007 | Cobb et al. | |
| 2007/0118826 A1 | 5/2007 | Lippincott | |
| 2007/0124708 A1 | 5/2007 | Robles et al. | |
| 2007/0198963 A1 | 8/2007 | Granik et al. | |
| 2008/0141195 A1 | 6/2008 | Robles et al. | |
| 2008/0193859 A1 | 8/2008 | Hamouda | |

FOREIGN PATENT DOCUMENTS

| | | |
|---|---|---|
| JP | 2004-502961 | 1/2004 |
| WO | WO 99/14637 | 3/1999 |
| WO | WO 99/14638 | 3/1999 |
| WO | WO 01/65315 | 9/2001 |
| WO | WO 2007/041135 | 4/2007 |

OTHER PUBLICATIONS

Oh et al., "Resolution Enhancement Through Optical Proximity Correction and Stepper Parameter Optimization for 0.12μm Mask Pattern", SPIE Conference on Optical Microlithography XII, SPIE vol. 3679, pp. 607-613 (1999).*

Chang et al., "A computational method for the correction of proximity effect inelectron-beam lithography", SPIE vol. 1671, pp. 208-214 (1992).*

Broeke et al. "Near 0.3 k1 Full Pitch Range Contact Hole Patterning Using Chromeless Phase Lithography (CPL)", $23^{rd}$ Annual BACUS Symposium on Photomask Technology, Proceedings of SPIE vol. 5256, pp. 297-308, Dec. 17, 2003.*

Chen, J. Fung, et al., "RET Masks for the Final Frontier of Optical Lithography," *Proceedings of the SPIE*, vol. 5853, Bellingham, Washington, 2005, pp. 168-179.

International Search Report, International Application No. PCT/US2006/037603, International Filing Date Sep. 25, 2006.

Written Opinion of the International Searching Authority, International Application No. PCT/US2006/037603, International Filing Date Sep. 25, 2006.

Cobb, N., "Flexible Sparse and Dense OPC Algorithms," *Proceedings of SPIE*, vol. 5853: *Photomask and Next-Generation Lithography Mask Technology XII*, Yokohama, Japan, Apr. 13, 2005, pp. 693-702.

Cobb, N., and Y. Granik, "Model-Based OPC Using the MEEF Matrix," *Proceedings of SPIE*, vol. 4889: *22nd Annual BACUS Symposium on Photomask Technology*, Monterey, Calif., Oct. 4, 2002, pp. 1281-1292.

Cobb, N., and A. Zakhor, "Experimental Results on Optical Proximity Correction With Variable Threshold Resist Model," *Proceedings of SPIE*, vol. 3051: *Symposium on Optical Microlithography X*, Santa Clara, Calif, Mar. 12, 1997, pp. 458-468.

Cobb, N., and A. Zakhor, "Fast, Low-Complexity Mask Design," *Proceedings of SPIE*, vol. 2440: *Symposium on Optical/Laser Microlithography VIII*, Santa Clara, Calif., Feb. 24, 1995, pp. 313-327.

Cobb, N., and A. Zakhor, "Fast Sparse Aerial Image Calculation for OPC," *Proceedings of SPIE*, vol. 2621: *15th Annual BACUS Symposium on Photomask Technology and Management*, Santa Clara, Calif, Sep. 20-22, 1995, pp. 534-545.

Cobb, N., and A. Zakhor, "Large Area Phase-Shift Mask Design," *Proceedings of SPIE*, vol. 2197: *Symposium on Optical/Laser Microlithography VII*, San Jose, Calif., Mar. 2-4, 1994, pp. 348-360.

Cobb, N., et al., "Mathematical and CAD Framework for Proximity Correction," *Proceedings of SPIE*, vol. 2726: *Symposium on Optical Microlithography IX*, Santa Clara, Calif., Mar. 13-15, 1996, pp. 208-222.

Cobb, N., and Y. Granik, "Using OPC to Optimize for Image Slope and Improve Process Window," (document labeled Nov. 20, 2002), *Proceedings of SPIE*, vol. 5130: *Photomask and Next-Generation Lithography Mask Technology X*, Yokohama, Japan, Apr. 16, 2003, pp. 838-846.

Granik, Y., "Source Optimization for Image Fidelity and Throughput," *Journal of Microlithography, Microfabrication, and Microsystems*, vol. 3, Oct. 2004, pp. 509-522.

Granik, Y., "Illuminator Optimization Methods in Microlithography," *Proceedings of SPIE*, vol. 5524: *Novel Optical Systems Design and Optimization VII*, Denver, Colorado, Aug. 2, 2004, pp. 217-229.

Granik, Y., "Solving Inverse Problems of Optical Microlithography," *Proceedings of SPIE*, vol. 5754: *Optical Microlithography XVIII*, San Jose, Calif., Mar. 1, 2005, pp. 506-526.

Granik, Y., "Generalized MEEF Theory," *Interface 2001*, Nov. 2001.
Granik, Y., and N. Cobb, "MEEF as a Matrix," *Proceedings of SPIE*, vol. 4562: *21st Annual BACUS Symposium on Photomask Technology*, Monterey, Calif., Oct. 2-5, 2001, pp. 980-991.
Granik, Y., and N. Cobb, "Two-Dimensional G-MEEF Theory and Applications," *Proceedings of SPIE*, vol. 4754: *Symposium on Photomask and Next-Generation Lithography Mask Technology IX*, Yokohama, Japan, Apr. 23-25, 2002, pp. 146-155.
Maurer, W., et al., "Process Proximity Correction Using an Automated Software Tool," *Proceedings of SPIE*, vol. 3334: *Optical Microlithography XI*, Santa Clara, Calif., Feb. 22-27, 1998, pp. 245-253.
Maurer, W., et al., "Evaluation of a Fast and Flexible OPC Package: OPTISSIMO," *Proceedings of SPIE*, vol. 2884: *16th Annual Symposium on Photomask Technology and Management*, Redwood City, Calif, Sep. 18-20, 1996, pp. 412-418.
Ohnuma, H., et al., "Lithography Computer Aided Design Technology for Embedded Memory in Logic," *Japanese Journal of Applied Physics* 37(12b):6686-6688, Dec. 1998.
Sturtevant, J., et al. "Considerations for the Use of Defocus Models for OPC," *Proceedings of SPIE*, vol. 5756: *Design and Process Integration for Microelectronic Manufacturing III*, San Jose, Calif., Mar. 4, 2005, pp. 427-436.
Sturtevant, J., et al. "Assessing the Impact of Real World Manufacturing Lithography Variations on Post-OPC CD Control," *Proceedings of SPIE*, vol. 5756: *Design and Process Integration for Microelectronic Manufacturing III*, San Jose, Calif., Mar. 4, 2005, pp. 240-254.
Van Den Broeke, D., et al., "Contact and Via Hole Mask Design Optimization for 65nm Technology Note," *Proceedings of SPIE*, vol. 5567: *24th Annual BACUS Symposium on Photomask Technology*, Monterey, Calif., Sep. 14, 2004, pp. 680-690.
Word, J., et al. "Advanced Layout Fragmentation and Simulation Schemes for Model Based OPC," *Proceedings of SPIE*, vol. 5754: *Optical Microlithography XVIII*, San Jose, Calif., Mar. 1, 2005, pp. 1159-1168.
Adam et al., "Improved Modeling Performance with an Adapted Vectorial Formulation of the Hopkins imaging Equation," *Proceedings of SPIE: Optical Microlithography XVI*, vol. 5040, pp. 78-91 (Feb. 25, 2003).
Brist et al., "Model-Assisted Placement of Sub-Resolution Assist features: Experimental Results," *Proceedings of SPIE: Design and Process Integration for Microelectronic Manufacturing*, vol. 5042, pp. 99-106 (Feb. 27, 2003).
Brueck et al., "Spatial Frequency Analysis of Optical Lithography Resolution Enhancement Techniques," *Proceedings of SPIE: Optical Microlithography XII*, vol. 3679, pp. 715-725 (Mar. 17, 1999).
Cobb et al., "New Concepts in OPC," *Proceedings of SPIE: Optical Microlithography XVII*, vol. 5377, pp. 680-690 (Feb. 24, 2004).
Cobb et al., "OPC Methods to Improve Image Slope and Process Window," *Proceedings of SPIE: Design and Process Integration for Microelectronic Manufacturing*, vol. 5042, pp. 116-125 (Feb. 27, 2003).
Granik, "New Process Models for OPC at sub-90nm Nodes," *Proceedings of SPIE: Optical Microlithography XVI*, vol. 5040, pp. 1166-1175 (Feb. 25, 2003).
Granik et al., "Universal process modeling with VTRE for OPC," *Proceedings of SPIE: Optical Microlithography XV*, vol. 4691, pp. 377-394 (Mar. 5, 2002).
Liebmann, "Layout Impact of Resolution Enhancement Techniques: Impediment or Opportunity?" *Proceedings of the 2003 International Symposium on Physical Design*, pp. 110-117 (Apr. 6-9, 2003).
Mentor Graphics Corporation, News and Views, "DSM Verification and Analysis," including a partial translation, 7 pp. (document marked Mar. 1999).
Mentor Graphics Corporation, News and Views, "OPC," including a partial translation, 11 pp. (document marked Mar. 1999).
Mentor Graphics Corporation, News and Views, "Calibre," including a partial translation, 9 pp. (document marked Apr. 2000).
Peterson, "Analytical Description of Anti-Scattering and Scattering Bar Assist Features," *Proceedings of SPIE: Optical Microlithography XIII*, vol. 4000, pp. 77-89 (Mar. 1, 2000).

Schellenberg, "Sub-Wavelength Lithography Using OPC," *Semiconductor Fabtech*, 9th ed., pp. 205-209 (Mar. 1999).
Torres et al., "Contrast-Based Assist Feature Optimization," *Proceedings of SPIE: Optical Microlithography XV*, vol. 4691, pp. 179-187 (Mar. 5, 2002).
Barouch et al., "Illuminator Optimization for Projection Printing," *Proc. SPIE*, vol. 3679, pp. 697-703 (1999).
Cobb et al., "Fast, Low-Complexity Mask Design," *Proc. SPIE*, vol. 2440, pp. 313-327 (1995).
Cobb, N.B., "Fast Optical and Process Proximity Correction Algorithms for Integrated Circuit Manufacturing," Dissertation, University of California at Berkeley, 123 pages (1998).
Erdmann et al., "Towards Automatic Mask and Source Optimization for Optical Lithography," *Proc. SPIE*, vol. 5377, pp. 646-657 (2004).
European Patent Office Communication pursuant to Article 94(3) EPC, European App. No. 06 815 527.4 (Feb. 9, 2009) (3 pages).
Fienup, J.R., "Phase Retrieval Algorithms: A Comparison," *Applied Optics*, vol. 21, pp. 2758-2769 (1982).
Gamo, H., "Matrix Treatment of Partial Coherence," in *Progress in Optics*, Ch. 3, pp. 189-332 (1963).
Gerchberg et al., "A Practical Algorithm for the Determination of Phase From Image and Diffraction Plane Pictures," *Optik*, vol. 35, pp. 237-246 (1972).
Gould, N., "Quadratic Programming: Theory and Methods," $3^{rd}$ *FNRC Cycle in Math, Programming*, Belgium, pp. 1-67 (2000).
Han et al., "On the Solution of Indefinite Quadratic Problems Using an Interior-Point Algorithm," *Informatica*, vol. 3, No. 4, pp. 474-496 (1992).
Hwang et al., "Layer-Specific Illumination for Low k1 Periodic and Semi-Periodic DRAM Cell Patterns: Design Procedure and Application," *Proc. SPIE*, vol. 5377, pp. 947-952 (2004).
Inoue et al., "Optimization of Partially Coherent Optical System for Optical Lithography," *Journal of Vacuum Science and Technology B*, vol. 10, No. 6, pp. 3004-3007 (1992).
Jang et al., "Manufacturability Evaluation of Model-Based OPC Masks," *Proc. SPIE*, vol. 4889, pp. 520-529 (2002).
Liu et al., "Binary and Phase-Shifting Image Design for Optical Lithography," *Proc. SPIE*, vol. 1463, pp. 382-399 (1991).
Liu et al., "Optimal Binary Image Design for Optical Lithography," *Proc. SPIE*, vol. 1264, pp. 401-412 (1990).
Nashold, K., "Image Synthesis—a Means of Producing Super-resolved Binary Images Through Bandlimited Systems," Dissertation, University of Wisconsin, Madison, pp. 1-127 (1987).
Oh et al., "Optical Proximity Correction of Critical Layers in DRAW Process of 12 um Minimum Feature Size," *Proc. SPIE*, vol. 4346, pp. 1567-1574 (2001).
Pati et al., "Phase-Shifting Masks for Microlithography: Automated Design and Mask Requirements," *Journal of the Optical Society of America A*, vol. 11, No. 9, pp. 2438-2452 (1994).
Poonawala et al., "Prewarping Techniques in Imaging: Applications in Nanotechnology and Biotechnology," *Proc. SPIE*, vol. 5674, pp. 114-127 (2005).
Qi et al., "Global Minimization of Normal Quartic Polynomials Based on Global Descent Directions," *SIAM Journal on Optimization*, vol. 15, No. 1, pp. 275-302 (2005).
Rosenbluth et al., "Optimum Mask and Source Patterns to Print a Given Shape," *Journal of Microlithography, Microfabrication, and Microsystems*, vol. 1, pp. 13-30 (2002).
Saleh et al., "Image Construction: Optimum Amplitude and Phase Masks in Photolithography," *Applied Optics*, vol. 24, pp. 432-1437 (1985).
Saleh, B.E.A., "Optical Bilinear Transformation: General Properties," *Optical Acta*, vol. 26, No. 6, pp. 777-799 (1979).
Sandstrom et al., "Optical Maskless Lithography for Economic Design Prototyping and Small-Volume Production," *Proc. SPIE*, vol. 5377, pp. 777-797 (2004).
Sayegh, S.I., "Image Restoration and Image Design in Non-Linear Optical Systems," Dissertation, University of Wisconsin, Madison, pp. 1-161 (1982).
Shang et al., "Model-based Insertion and Optimization of Assist Features with Application to Contact Layers," *Proc. SPIE*, vol. 5992, pp. 633-642 (2005).

Sorensen, D.C., "Newton's Method With a Model Trust Region Modification," *SIAM Journal of Numerical Analysis*, vol. 19, No. 2, pp. 409-426 (1982).

Takajo et al., "Further Study on the Convergence Property of the Hybrid Input-Output Algorithm Used for Phase Retrieval," *Journal of the Optical Society of America A*, vol. 16, No. 9, pp. 2163-2168 (1999).

Vallishayee et al., "Optimization of Stepper Parameters and Their Influence on OPC," *Proc. SPIE*, vol. 2726, pp. 660-665 (1996).

U.S. Appl. No. 60/515,708, filed Oct. 31, 2003, Laidig.

U.S. Appl. No. 60/439,808, filed Jan. 14, 2003, Socha et al.

U.S. Appl. No. 60/439,807, filed Jan. 14, 2003, Van Den Broeke et al.

European Patent Office, Communication pursuant to Article 94(3) EPC for European Patent Application No. 06815527.4, Feb. 9, 2009, 3 pages.

Applicant's Reply and Amendments to European Patent Application No. 06815527.4, Dec. 4, 2009, 19 pages.

* cited by examiner

MODEL-BASED SRAF INSERTION

CROSS-REFERENCE TO RELATED APPLICATION

The present application claims the benefit of U.S. Provisional Application No. 60/658,278, filed Mar. 2, 2005.

FIELD OF THE INVENTION

The present invention relates to the preparation of layout data for use in a photolithographic processing system and, in particular, to resolution enhancement techniques for improving the quality of a printed layout pattern on a semiconductor wafer.

BACKGROUND OF THE INVENTION

In conventional photolithographic processing, integrated circuits are created on a semiconductor wafer by exposing the wafer with a pattern of features on a mask or reticle. The pattern of features selectively exposes photosensitive chemicals on a wafer that is then further chemically and mechanically processed to build up layers of the integrated circuit.

As the features on a mask become smaller and smaller, optical distortions can occur whereby the exposure pattern created on a wafer will not match the pattern of features on the mask. To correct this, numerous resolution enhancement techniques (RETs) may be employed to improve the image quality so that the exposure pattern on a wafer more faithfully matches the pattern of features desired. Such RETs often comprise making extensive changes to the corresponding pattern of features on a mask to compensate for the known distortions in the imaging process.

With conventional resolution enhancement techniques, data for a pattern of mask features are analyzed with a computer program to estimate how a corresponding pattern of features will print on a mask. The data for the individual mask features or portions thereof may be adjusted such that the pattern created on the wafer will more faithfully match the desired layout. In addition, features, such as subresolution assist features (SRAFs), may be added to the layout data as necessary to improve printing fidelity. Typically, SRAFs are rectangular elements that are positioned adjacent to an edge of a feature in order to improve the contrast of the feature. The shape, size and placement of the SRAFs are typically predetermined, and often follow simple geometric rules.

While conventional resolution enhancement techniques are functional at compensating for some process distortions, a better match between the image produced and the image desired can be achieved.

SUMMARY OF THE INVENTION

To further improve the fidelity of a lithographic image to the desired layout pattern, the present invention is a system for generating mask layout data that approximates an optimized mask layout pattern that has been calculated to print a target pattern of features with a photolithographic process. The target layout pattern or portion thereof is received and the optimized mask layout pattern is calculated using the target layout pattern and the known parameters of a photolithographic printing system. The optimized mask layout pattern includes a number of printing features that correspond to features in the target layout and a number of non-printing features. In one embodiment of the invention, the mask layout data is generated from the optimized mask layout pattern by approximating one or more of the non-printing features as sub-resolution assist features (SRAFs). These SRAFs can in particular be generated with further constraints and criteria based on manufacturability parameters derived from the mask fabrication and/or wafer manufacturing processes.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1:
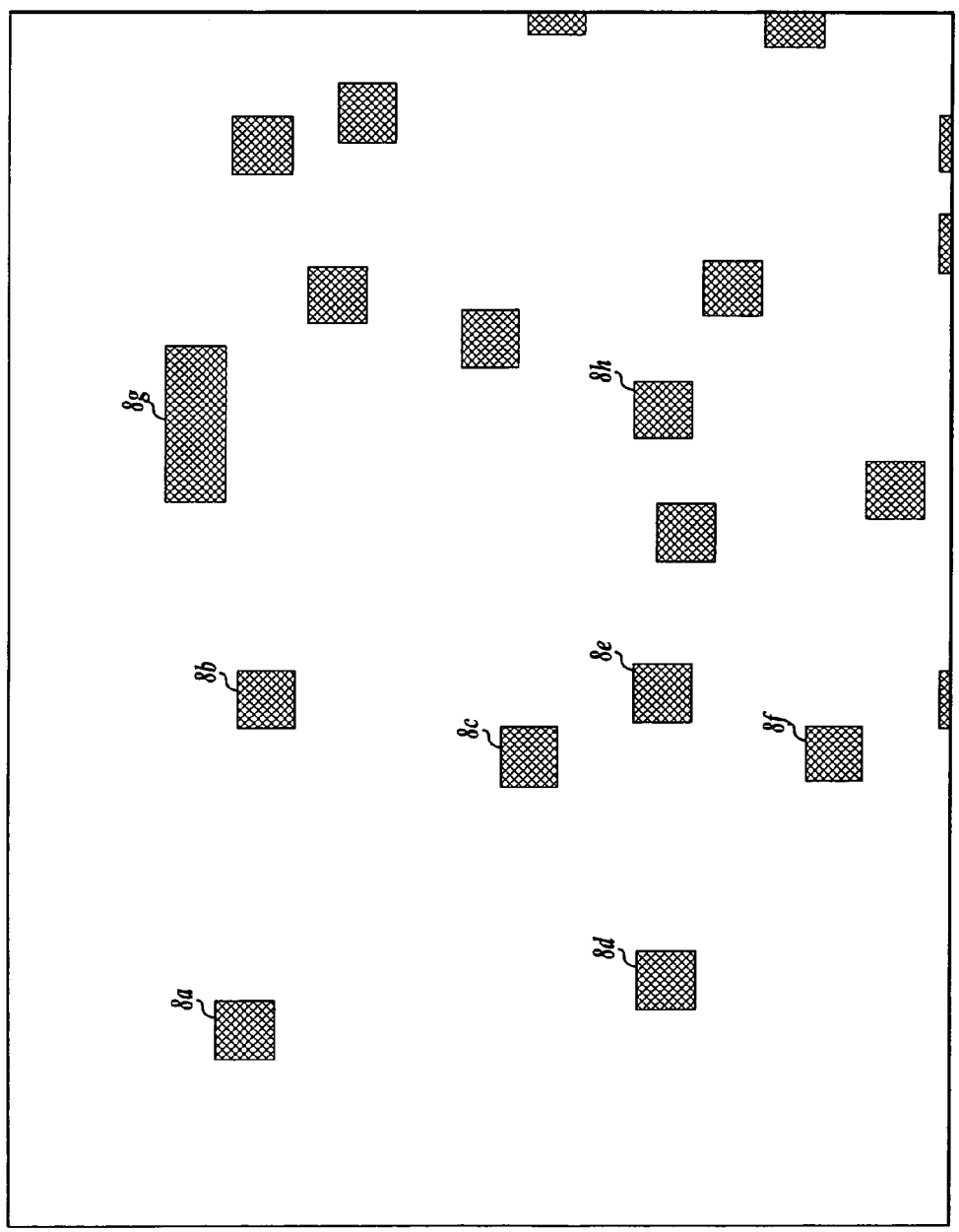
FIG. 1 illustrates an example for a target pattern of features to be created on a semiconductor wafer.

As indicated above, the present invention is a system for approximating an optimized mask layout pattern for use in printing a target pattern of features with a photolithographic process. FIG. 1 illustrates a layout pattern of target features 8a, 8b, 8c ... 8h etc., to be created on a semiconductor wafer.

In the example shown, the target features 8a-8h, etc. are square or rectangular contact pads in an integrated circuit. In the example, the normal 4× magnification of the mask features over the wafer features has also been assumed, and mask features are shown at the same scale of the corresponding wafer.

Figure 2:
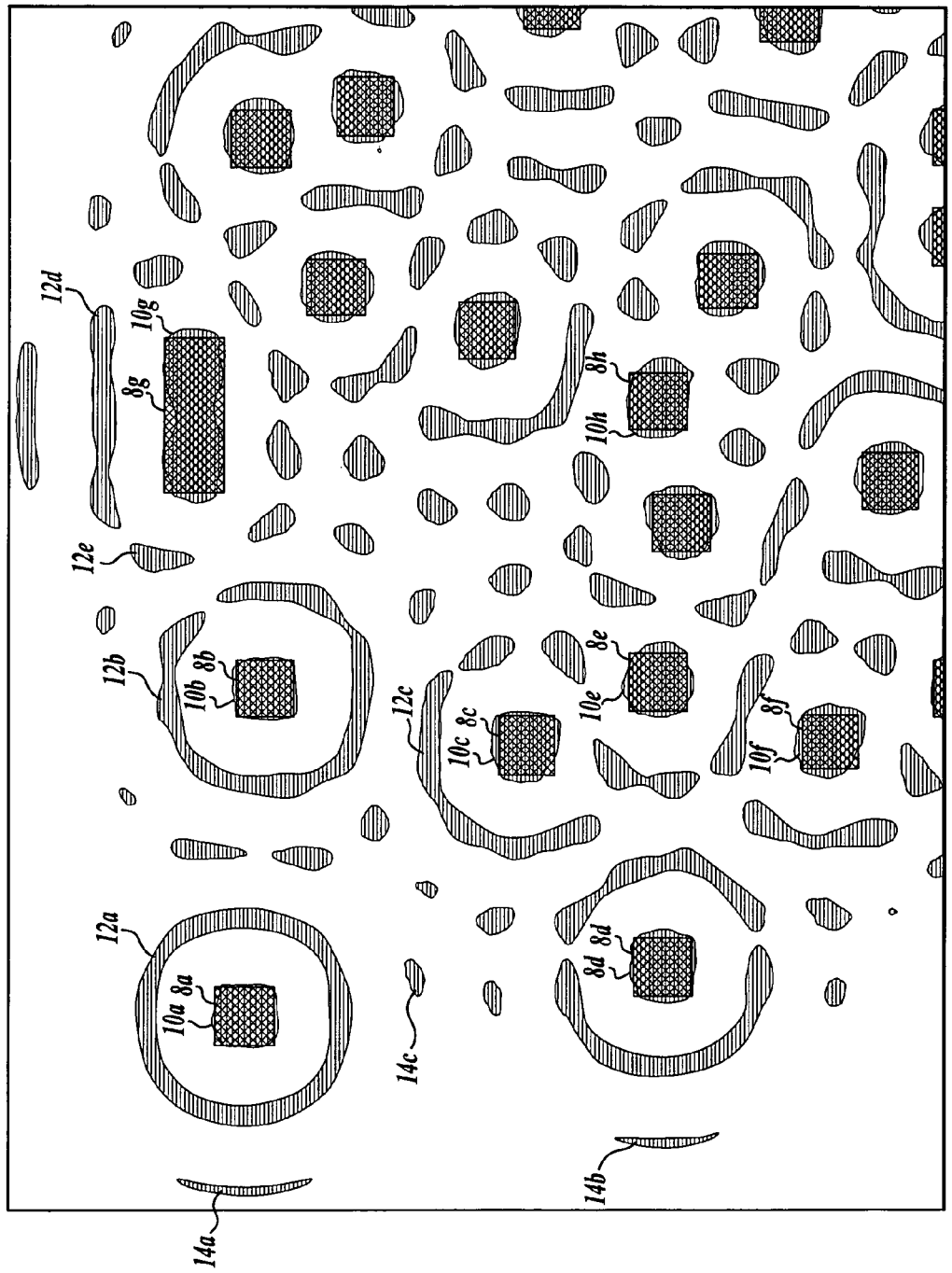
FIG. 2 illustrates an optimized mask layout pattern calculated to print the target pattern of features on a semiconductor wafer shown in FIG. 1.

FIG. 2 illustrates one possible optimized mask layout pattern that is calculated to print the target features of FIG. 1. In the example shown in FIG. 2, the optimized mask layout pattern includes irregular polygons 10a, 10b, 10c, etc., corresponding to and occupying approximately the same position as each target feature/contact pad 8a, 8b, 8c ..., to be created on the wafer. Also included in the optimized mask layout pattern are a number of first order non-printing features 12a, 12b, 12c ... and second order non-printing features 14a, 14b, 14c .... At least some features are necessary in order to achieve an optimum printing of the individual target features 8a-8h .... The non-printing features 12a, 12b, 12c ... are generally irregularly shaped polygons. This is generally a function of the inverse calculation performed to calculate the optimized mask layout pattern. Each polygon for the printing and non-printing features is stored in a layout database.

In one embodiment of the invention, the optimized mask layout pattern shown in FIG. 2 is calculated by reading in the target layout data, or portion thereof, from a layout database. Typically, the target layout data is stored as a number of polygons in a layout language such as GDS-II or OASIS™. In the example shown, the target layout database stores a polygon for each of the contact pads to be created on a wafer. In some embodiments, the layout database may store polygons hierarchically, whereby the data for a repeated target feature may be defined once in the database along with a list of where each instance of the target feature is to be printed on the wafer.

From the target layout data received and the known properties of the photolithographic system that will be used to print the mask layout data on a wafer, a calculation is performed with a computer system to determine what the optimized mask layout pattern should be in order to actually print the target layout of features 8 on a wafer. In one embodiment of the invention, the calculation of the optimized mask layout pattern comprises creating an inverse image of the target pattern using Fourier transforms and numerical de-convolution. In one embodiment of the invention, a gradient of an objective function based on the difference between a simulated image of the mask layout and the target image is generated analytically by convolution, and individual pixels in the mask layout are systematically changed to minimize this objective function. In one embodiment of the invention, the changes to the individual pixels can be further constrained by additional mask constraints, such as a minimum pixel size, total number of mask writer shots, or other mask writing limitations. In one embodiment of the invention, the calculation of the optimized mask layout pattern comprises optimizing both the mask and the illumination.

In one embodiment of the invention, the calculation of the optimized mask layout pattern is performed in accordance with techniques described in the paper "Solving Inverse Problems of Optical Microlithography" by Yuri Granik, published in Optical Microlithography XVIII, Proceedings of the SPIE Vol. 5754, pp. 506-526 (May 2005) and contained in U.S. Provisional Application No. 60/658,278, which are expressly incorporated by reference. In another embodiment of the invention, the optimized mask layout pattern is calculated in the manner described in U.S. Provisional Patent Application No. 60/722,840, titled "Fast Pixel-Based Mask Optimization for Inverse Lithography" by Yuri Granik, which is filed concurrently herewith and expressly incorporated by reference herein.

As used herein, the term "optimized" mask layout pattern refers to a layout pattern that is calculated mathematically from the target layout data and one or more optical parameters, e.g., illumination system, numerical aperture NA, illumination wavelength λ, etc. and process parameters such as print bias, resist threshold, etch bias, etc.

Once the optimized mask layout pattern has been calculated for printing the target pattern of features on a wafer, the non-printing features of the mask pattern are analyzed. Some of the non-printing features, for example, feature 12a, completely surround a printing feature, i.e., feature 10a. Other non-printing features, e.g., feature 12e, are merely nearby a corresponding printing feature, e.g., 10g. As indicated above, the optimized mask layout pattern also includes a number of second order non-printing features 14a, 14b, etc. For example, feature 14a is a second order feature to the printing feature 10a because it is farther away from the printing feature 10a than the primary or first order non-printing feature 12a.

Figure 3:
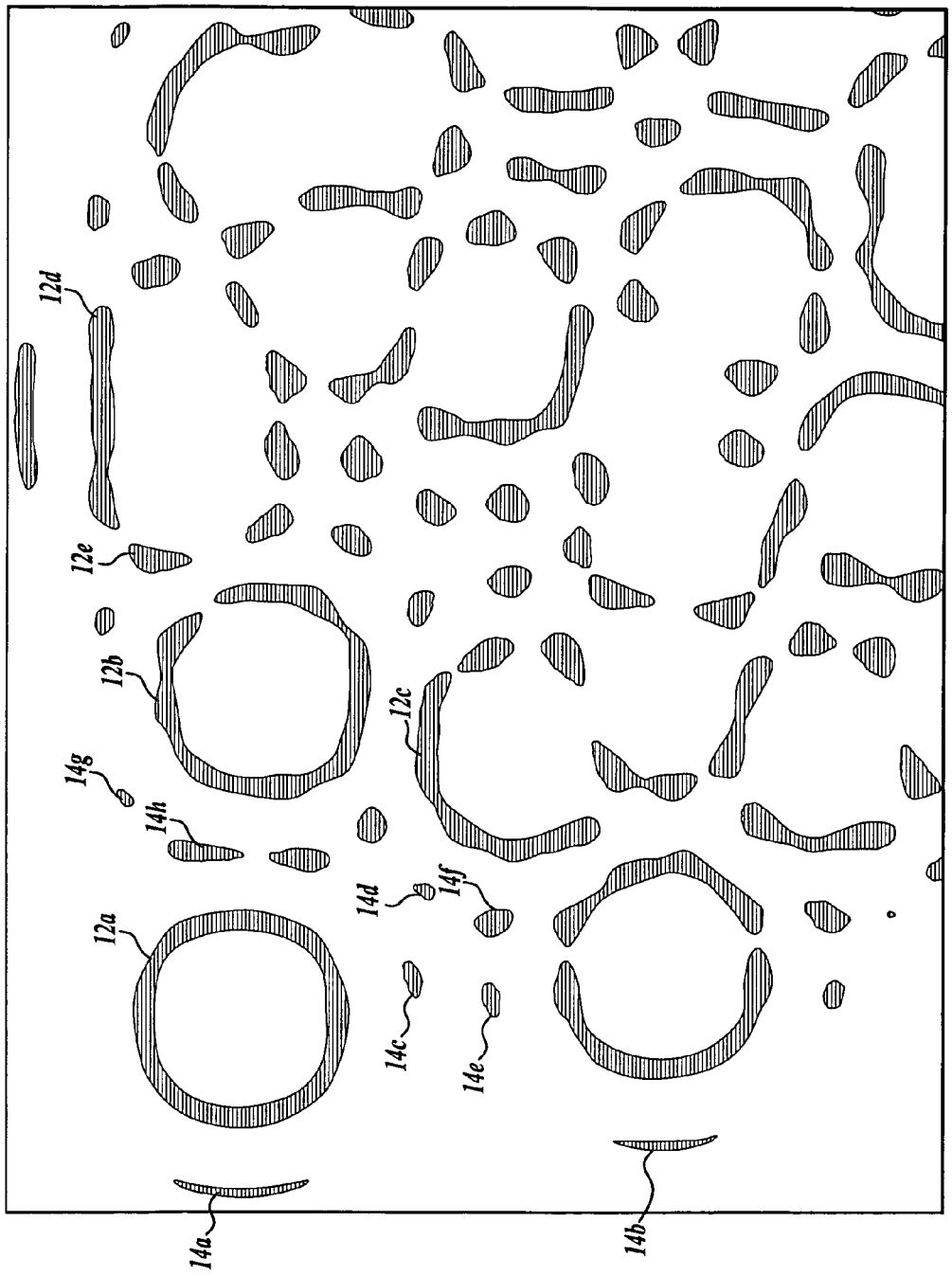
FIG. 3 illustrates a number of non-printing features contained in the optimized mask layout pattern shown in FIG. 2.

FIG. 3 illustrates the optimized mask layout pattern with the printing features 10a-10h etc. removed, thereby leaving the non-printing features 12a, 12b, 12c . . . 14a, 14b, . . . . In one embodiment of the invention, second order non-printing features are not approximated in the mask layout data created. However, if time and processing power permit and if the features can be approximated on a mask, such second order (or higher) features can be included in the final mask layout data, if desired.

Figure 4:
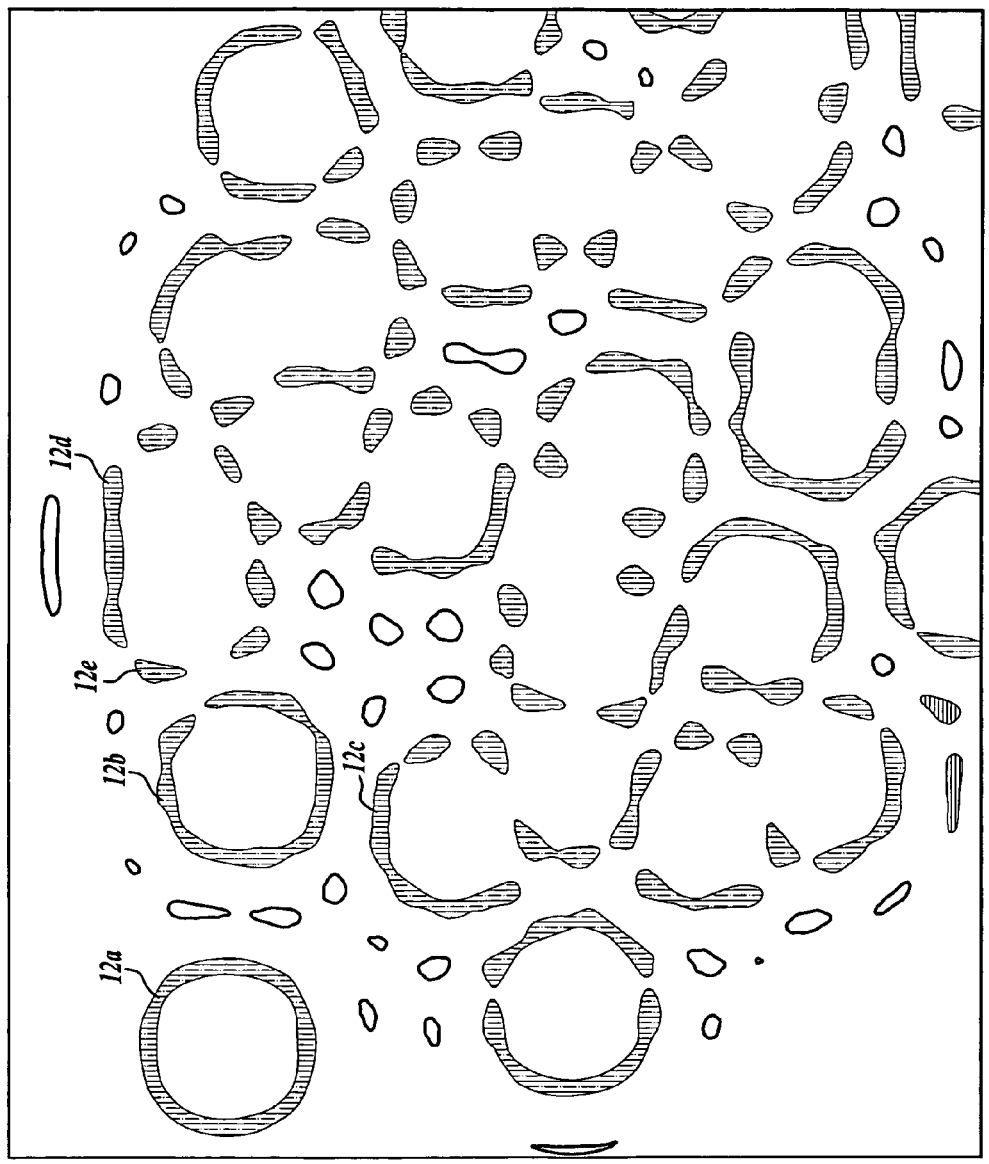
FIG. 4 illustrates a number of first order or primary non-printing features identified within the optimized mask layout pattern.

FIG. 4 illustrates the first order non-printing features 12 (shown as shaded) identified from the second order non-printing features 14 (shown as non-shaded). In one embodiment, the first order non-printing features 12 are identified in the optimized mask layout pattern by creating a set of polygons, with each of the printing features surrounded by a polygon. The dimension of the polygon will typically be the dimension of the printing feature expanded by a predetermined amount. This amount will typically be the sum of 1) a predetermined allowable distance between a printing feature and a first order non-printing feature, and 2) an additional amount added to accommodate the complete non-printing feature. This additional amount can be, for example, a factor of two or more times the typical non-printing feature width. A logical Boolean operation (typically an AND operation) is then carried out between the features of the optimized mask layout pattern and the polygons. Non-printing features which overlap the polygons are considered to be first order non-printing features, while those that do not overlap the polygons are higher order non-printing features. The critical maximum distance between printing features and the first order non-printing features is determined by evaluating the full mask optimization data. This distance typically varies according to the particular photolithographic process to be used and the target design to be created.

As can be seen, the non-printing features shown in FIGS. 3 and 44 generally have irregular shapes that either cannot be directly produced on a mask or would require too much time or memory to produce accurately on a mask. Typically, mask writers are limited by one or more parameters, including a minimum jog width for the beam writer and certain allowed angles with which mask features can be defined, and mask writing time can increase in proportion to the number of exposure shots required. To approximate a curved feature, several shots may be required where only one is needed for an equivalent rectangle. These limitations can prevent the non-printing features from being written on a mask directly. In addition, incorrect interpretation of these detailed shapes by the fracturing software used to convert data to mask writer formats can result in these features being incorrectly rendered, with odd polygonal shapes, additional unwanted jogs, or other structures that will not function correctly when included on the mask. Therefore, in one embodiment of the invention, one or more of the non-printing features of an optimized mask layout are analyzed and approximated with subresolution assist features that can be printed on a mask.

Figure 5:
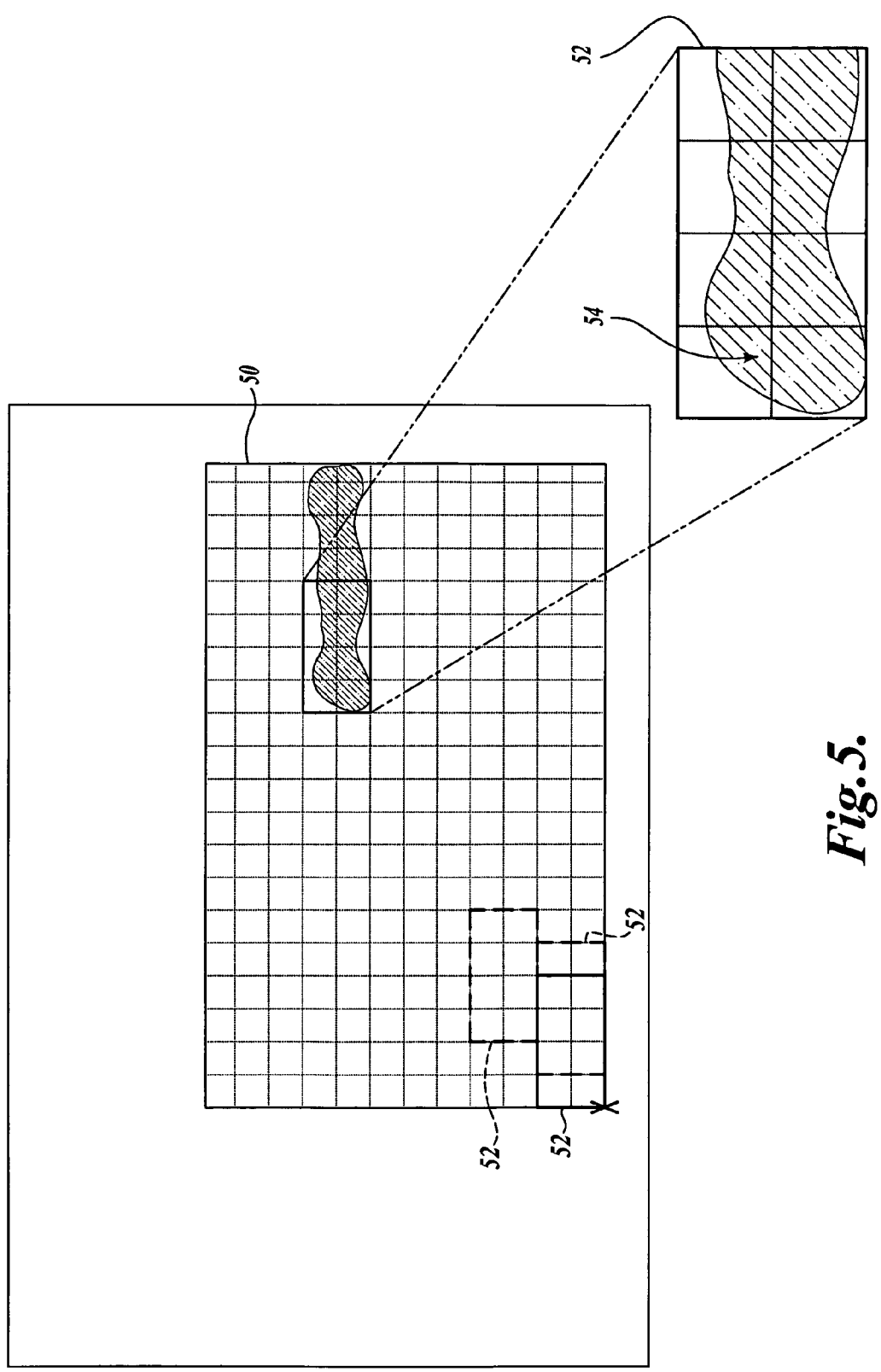
FIG. 5 illustrates a method of creating mask layout data that approximates one or more of the non-printing features in the optimized mask layout pattern in accordance with an embodiment of the present invention.

One method of generating mask features that approximate one or more of the non-printing features in the optimized mask layout pattern is shown in FIG. 5. In the embodiment shown, an area 50 of the optimized mask layout pattern is selected and divided into a grid having a number of cells. In one embodiment, each grid cell has a dimension corresponding to the minimum jog size of the mask writer to be used in creating the masks. The grid cells may be square but that is not required. The search area 50 is analyzed with a mathematical algorithm or numerical program in which an analysis window 52 has a length and width equal to a preset number of grid cells. The analysis window 52 is generally rectangular or square but could be other shapes. In the example shown in FIG. 5, the analysis window 52 is a rectangle having a width of four grid cells and a height of two grid cells. The analysis window 52 is compared to various regions of the search area 50 by using a numerical algorithm that places a corner of the window 52 at a corresponding corner of a grid cell, and then stepping the location through each of the grid cells one-by-one. Next, it is determined if the analysis window 52 overlaps an area of a first order non-printing feature. In one embodiment shown, the area of the non-printing feature contained by the analysis window 52 is compared to the area of the analysis window to determine what the percentage of the window is occupied by a non-printing feature. If the area occupied is greater than some predetermined threshold, a polygon having a dimension equal to the dimensions of the analysis window 52 is defined in the mask layout data. The mask layout data is typically created in a separate data layer, distinct from the data layers used to represent the polygons of the target layout and also the those that represent the optimized mask layout pattern. This process is repeated until the window is stepped through the entire search area 50.

Figure 6:
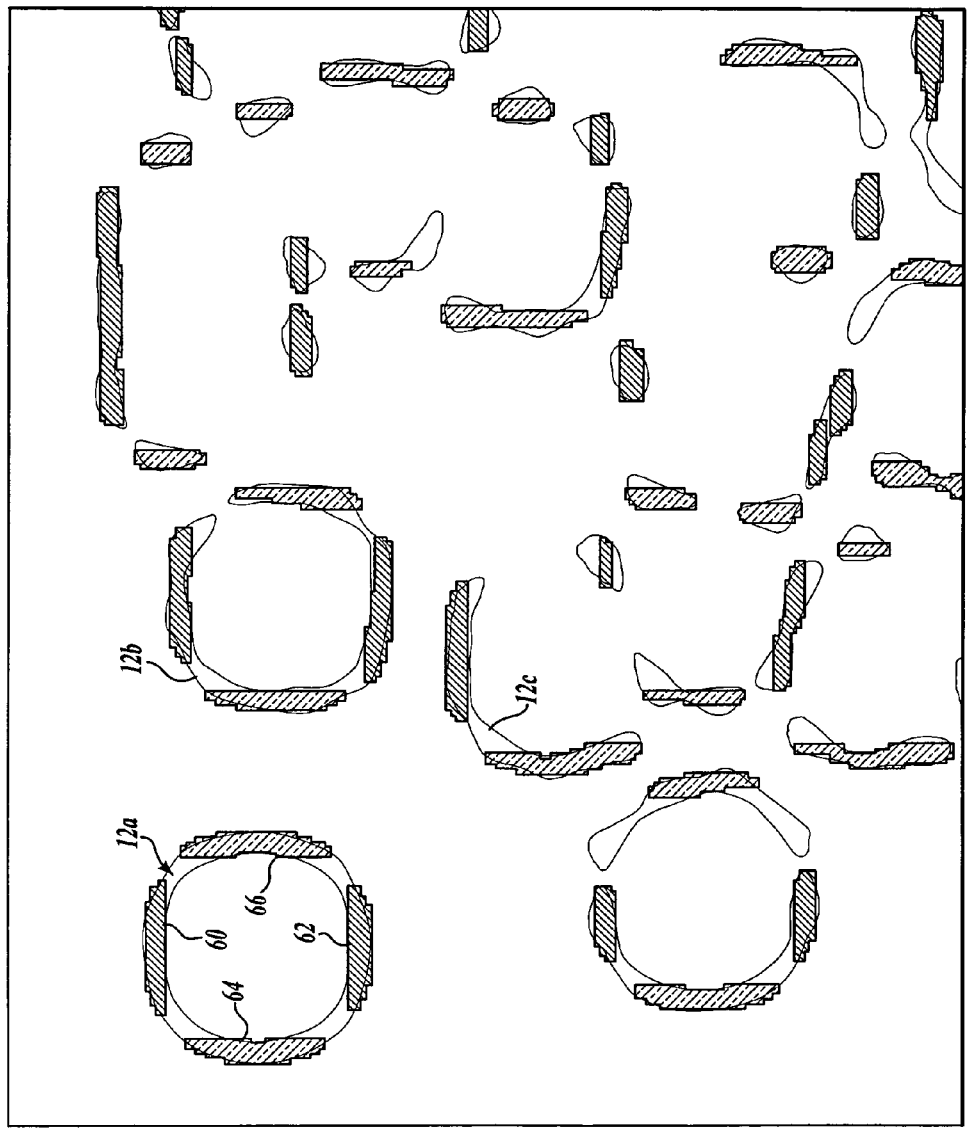
FIG. 6 illustrates a number of polygons defined in the mask layout data to approximate one or more of the non-printing features.

If the analysis window 52 is not square, the orientation of the window can be changed and the window stepped through the search area 50 again. In the example shown, the analysis window 52 is rotated by 90 degrees to be two grid cells wide and four grid cells high to capture vertically oriented portions of the non-printing features. FIG. 6 illustrates a number of polygons 60, 62, 64, 66 overlaying a non-printing feature 12a. The polygons 60-66 are defined to approximate portions of the non-printing feature 12a. Polygons 60 and 62 are created by stepping a horizontally oriented, rectangular analysis window through the optimized mask layout pattern. In addition, polygons 64 and 66 are defined to approximate portions of the non-printing feature 12a by stepping a vertically oriented rectangular analysis window through the optimized mask layout pattern.

Figure 7:
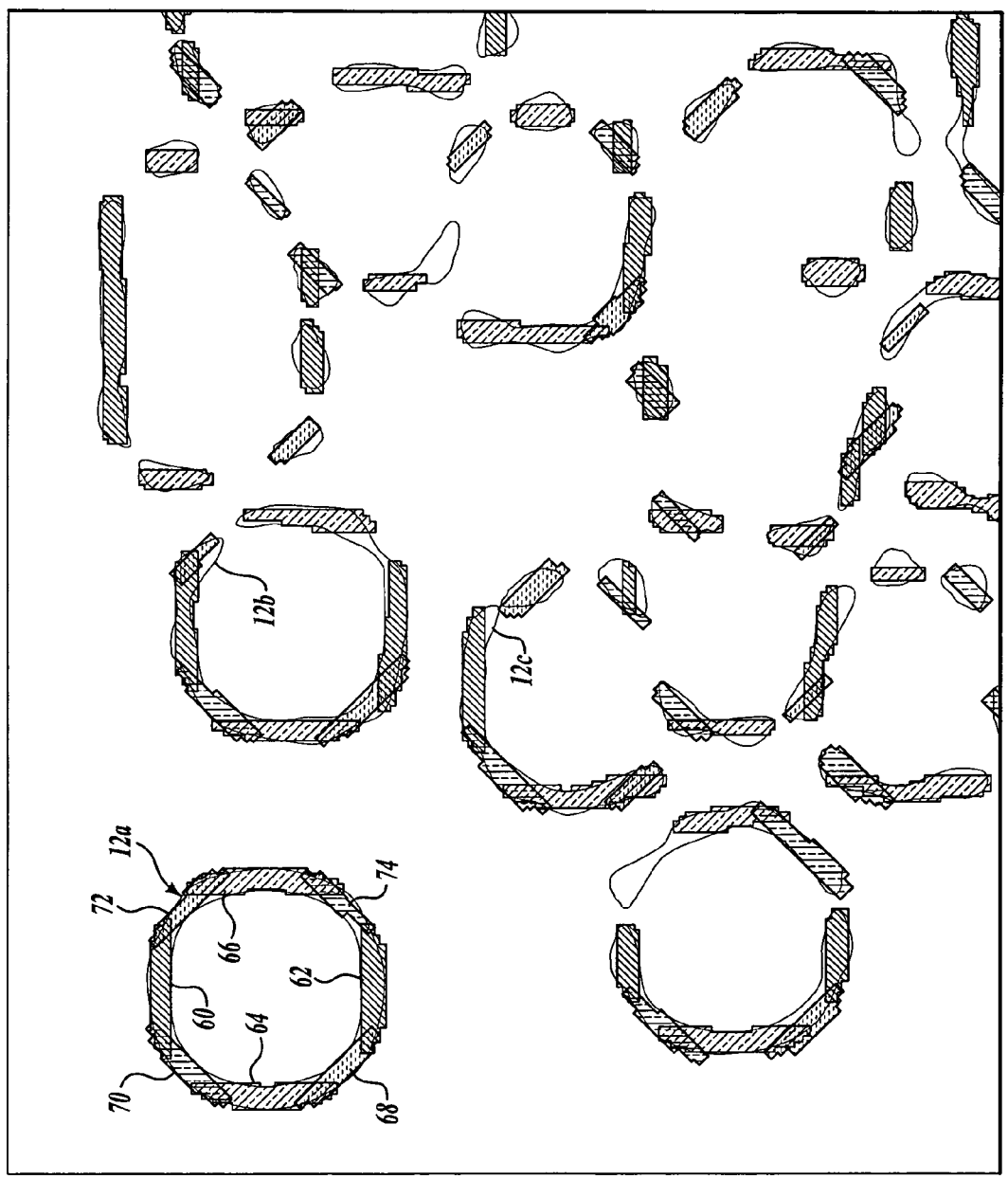
FIG. 7 illustrates a number of polygons defined in the mask layout data to approximate one or more of the non-printing features, including polygons oriented at 45 degree angles.

In some instances, a mask writer can write geometries at an angle such as ±45 degrees. Therefore, if the mask layout data is to be used with such a mask writer, the optimized mask layout pattern can be rotated by ±45 degrees and the above process of searching areas with an analysis window repeated. FIG. 7 illustrates additional polygons 68, 70, 72, 74, positioned over a corresponding feature 12a. The polygons 68-79 are defined in the mask layout data to approximate the non-printing feature 12a. The polygons 68-74 are obtained by creating a version of the optimized mask layout pattern with coordinates rotated at angles of ±45 degrees, stepping a rectangular search window through the pattern in the manner described above, then rotating the coordinates of the mask data generated in this step by an inverse of the original rotation. The inverse rotation ensures that all mask data is written using the same orientation as the original target data.

As will be appreciated, each of the polygons 60-74 is initially defined as a series of rectangular (or other shape) polygons corresponding to the shape of the analysis window. For example, a single polygon may be defined for each group overlapping polygons by including the outer perimeter of the overlapping polygons. The combined polygon defines a sub-resolution assist feature within the mask layout data because the polygon is not large enough to print on a wafer but does aid in printing a target feature.

Once the mask data are determined that approximate one or more of the non-printing features of optimized mask layout pattern, a data clean-up step can be executed. In one embodiment, polygons or portions thereof in the mask layout data that overlap can be removed if the density of one of the overlapping polygons is less than that of another. Similarly, the maximum width of an individual polygon can be thinned to have a width that is less than the maximum width of a non-printing feature for the photolithographic processing system to be used. Similarly, the maximum length of any polygon can be shortened to be less than the length of a maximum non-printing feature.

In yet another embodiment, irregularly shaped polygons that approximate a non-printing feature or portion thereof can be simplified to remove jogs or other features that are difficult to write on a mask, or the shot count has increased to such a degree that the write time is too long. The exact parameters and limitations of the clean-up step can be selected by a user, and can use criteria based on rules derived from the printing capabilities of the mask writer or can be based on a model simulation of how the polygons will behave during photolithographic processing.

Although the embodiment of the present invention described operates to create mask layout data features that approximate one or more first order, non-printing features in the optimized mask layout pattern, it will be appreciated that polygons that approximate the second order or higher non-printing features could also be included in the mask layout data if desired.

Figure 8:
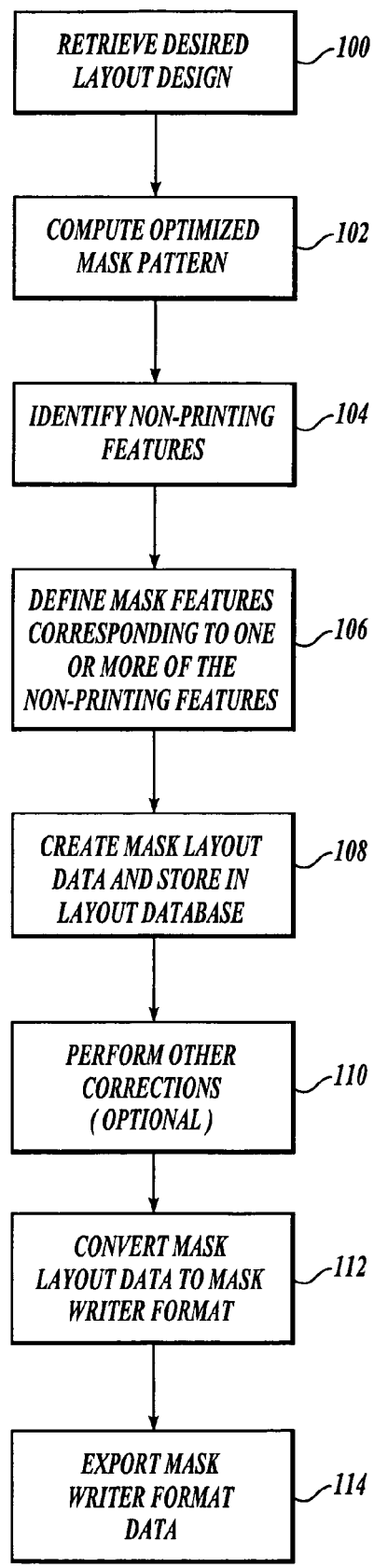
FIG. 8 is a flow chart of a method of creating mask layout data that approximates an optimized mask layout pattern in accordance with one embodiment of the present invention.

FIG. 8 is a flow chart illustrating a series of steps performed by one embodiment of the present invention in order to produce mask layout data for one or more masks to print a target layout pattern. Beginning at 100, target layout data for a layout design, or portion thereof, is retrieved from a layout database. At 102, an optimized mask layout pattern is computed from the target layout data and the optical properties of the photolithographic system to be employed in printing the target layout.

At 104, the non-printing features of the optimized mask layout pattern are identified. These can be copied to a separate data layer containing only these non-printing features, or remain in a data layer merged with printing features. At 106, mask features are defined that approximate all or a portion of one or more of the non-printing features. As described above, in one embodiment of the invention, subresolution assist features are defined to approximate only the first order non-printing features. However, subresolution assist features that approximate higher order non-printing features can be included in the mask layout data, if desired. At 108, the mask layout data is created by merging the printing features and the sub-resolution assist features corresponding to the non-printing features and is stored in a database.

The data for the printing features can be either the polygons 10 computed in the optimized mask layout pattern or can be the polygons that describe the original target features 8. The mask layout data, including the data for the target features and the data that correspond to the non-printing features, is then finalized. In some embodiments of the invention, additional analysis and correction of the mask layout data may be performed (such as DRC, OPC, PSM, etc.) at 110. At 112, the finalized data is converted to standard encapsulation formats such as GDS-II or OASIS, or converted (fractured) into mask writer formats (MEBES, Hitachi, .MIC, etc.). At 114, the finalized, converted mask data is exported, for example, to a mask writer to create one or more masks used for creating the target pattern features on a semiconductor wafer.

Figure 9:
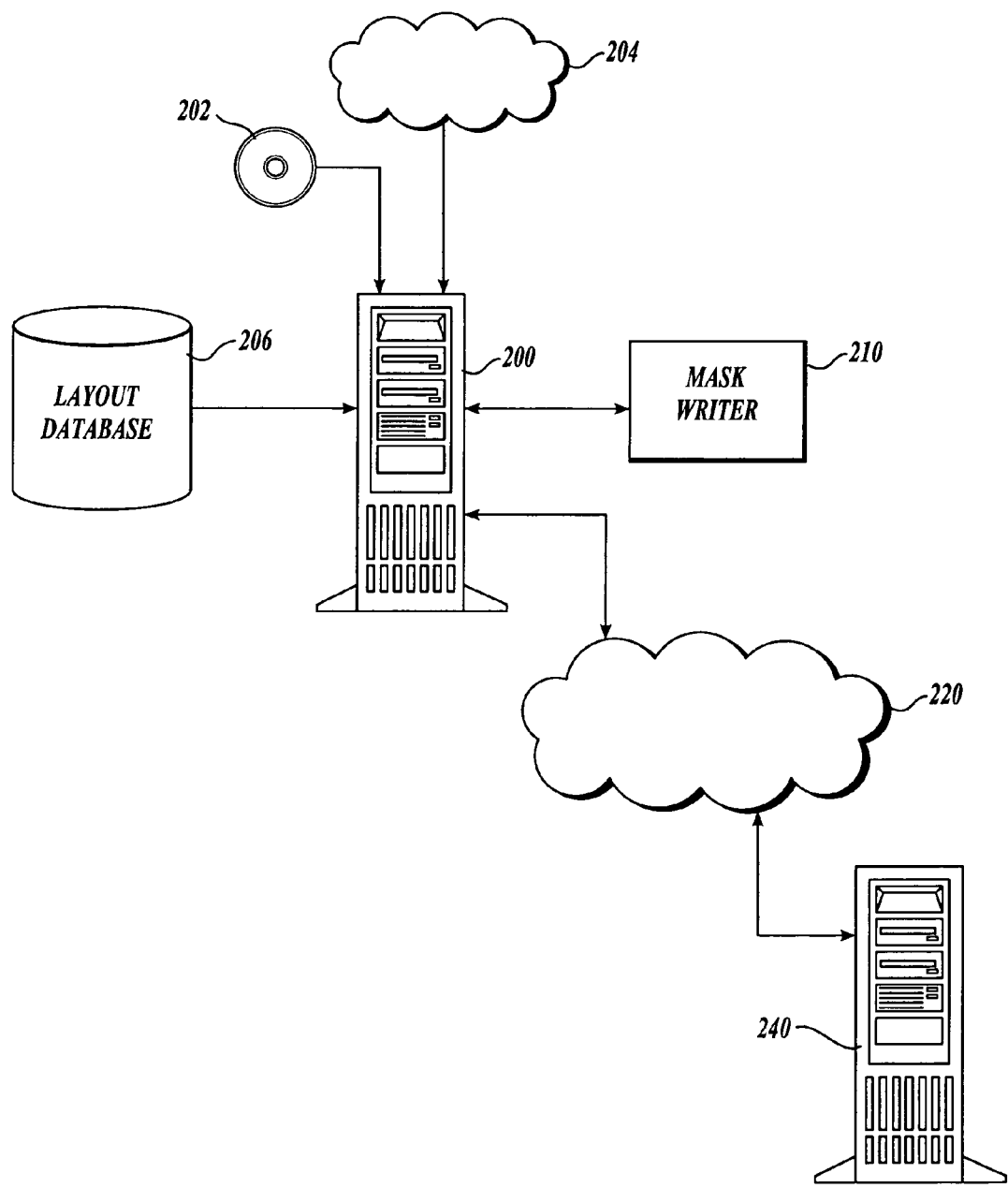
FIG. 9 illustrates a representative computer system that can implement the present invention.

FIG. 9 illustrates one embodiment of a computer system that can be used to implement the present invention. In the example shown, a computer system 200 includes one or more programmable processors that receive a set of executable instructions on a computer-readable media 202. Alternatively, the instructions may be received from a wireless or wired communications link 204. The computer system 200 executes the instructions to receive target layout data from a layout database 206 in order to compute mask layout data that can be transmitted to a mask writer 210, as described above.

The computer system 200 may be a stand alone, single or multiprocessor device or may be a networked or parallel processing computer system. In addition, the computer system 200 may be connected by a communication link 220, such as the Internet, to one or more remotely located computers 240. Target layout data can be retrieved from the layout database and transmitted to the remotely located computer 240, which may be inside or outside the United States, to perform the mask data calculations as described above. Mask layout data from the remotely located computer 240 can be returned to the computer system 200 or transmitted directly to the mask writer 210 to create one or more corresponding masks or reticles.

While the preferred embodiment of the invention has been illustrated and described, it will be appreciated that various changes can be made therein without departing from the scope of the invention. It is therefore intended that the scope of the invention be determined from the following claims and equivalents thereof.

The embodiments of the invention in which an exclusive property or privilege is claimed are defined as follows:

1. A method of preparing mask layout data for use in a photolithographic printing system to create a pattern of features on a semiconductor wafer, comprising:
    receiving target layout data that defines a pattern of features to be printed on a semiconductor wafer;
    determining an optimized mask layout pattern that will produce the pattern of features on a semiconductor wafer, wherein the optimized mask layout pattern includes data for printing features and data for a number of non-printing features, and wherein the optimized mask layout pattern is determined by computing a deconvolution,
    defining one or more subresolution assist features in the mask layout data that approximates one or more non-printing features; and
    using a computer, combining the data for the subresolution assist features and the data for the printing features to create the mask layout data.

2. One or more computer-readable storage media storing a sequence of program instructions that when executed by a computer causes the computer to perform a method, the method comprising:
    receiving target layout data that defines a pattern of features to be printed on a semiconductor wafer;
    determining an optimized mask layout pattern that will produce the pattern of features on a semiconductor wafer, wherein the optimized mask layout pattern includes data for printing features and data for non-printing features;
    stepping a first analysis window at a predefined first orientation through at least a portion of the optimized mask layout pattern;
    determining if the analysis window overlaps with at least a portion of a first non-printing feature;
    defining a first subresolution assist feature for mask layout data if the analysis window and the first non-printing feature overlap by a first predetermined amount:
    stepping a second analysis window at a second orientation through at least a portion of the optimized mask layout pattern;
    determining if the second analysis window overlaps with a least a portion of a second non-printing feature;
    defining a second subresolution assist feature for the mask layout data if the second analysis window and the second non-printing feature overlap by a second predetermined amount; and
    storing data for the first subresolution assist feature and the second subresolution assist features.

3. The one or more computer-readable storage media of claim 2, wherein the first orientation is orthogonal to the second orientation.

4. The one or more computer-readable storage media of claim 2, wherein the first orientation is oriented about 45 degrees to the second orientation.

5. The one or more computer-readable storage media of claim 2, wherein the method further comprises:
    determining an area of overlap between the first subresolution assist feature and the second subresolution assist feature; and
    modifying one of the first subresolution assist feature or the second subresolution assist feature to reduce the area of the overlap.

6. A method of preparing mask layout data for use in a photolithographic printing system comprising:
    receiving target layout data that defines a pattern of features to be printed on a semiconductor wafer;
    determining an optimized mask layout pattern that will produce the pattern of features on a semiconductor wafer, wherein the optimized mask layout pattern includes data for printing features and data for non-printing features;
    using a computer, selecting one or more of the non-printing features based in part upon on a distance between one or more of the non-printing features and at least one of the printing feature, wherein the distance is calculated using one or more Boolean operations on the one or more of the non-printing features and the at least one of the printing features;
    defining data for one or more subresolution assist features that approximate the selected non-printing features, wherein at least one of the sub resolution assist features is defined by:
    defining a first polygon that approximates a respective selected non-printing feature,
    defining a second polygon that approximates the respective selected nonprinting feature, wherein the second polygon is different than the first polygon, and
    combining the first polygon and the second polygon to produce data for the at least one of the sub resolution features; and
    creating the mask layout data at least in part from the data for the subresolution assist features and the data for the printing features.

* * * * *